United States Patent
Benmouyal et al.

(10) Patent No.: US 7,498,818 B2
(45) Date of Patent: Mar. 3, 2009

(54) APPARATUS AND METHOD FOR DETECTING A BRUSH LIFTOFF IN A SYNCHRONOUS GENERATOR ROTOR CIRCUIT

(75) Inventors: Gabriel Benmouyal, Boucherville (CA); Thanh-Xuan Thi Nguyen, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 121 days.

(21) Appl. No.: 11/510,352

(22) Filed: Aug. 25, 2006

(65) Prior Publication Data

US 2008/0048666 A1  Feb. 28, 2008

(51) Int. Cl.
G01R 31/14 (2006.01)
G01R 31/00 (2006.01)
H02H 3/00 (2006.01)
(52) U.S. Cl. ............................ 324/509; 361/42; 702/58
(58) Field of Classification Search ................. 324/509, 324/500, 510, 512, 522, 523, 525, 555, 519, 324/527, 756; 340/650, 651, 3.43; 361/42; 702/57, 58, 59, 185
See application file for complete search history.

(56) References Cited

U.S. PATENT DOCUMENTS

| | | | |
|---|---|---|---|
| 2,881,319 A | 4/1959 | Sills | |
| 3,727,123 A * | 4/1973 | Smith | 322/99 |
| 3,973,171 A | 8/1976 | Howell | |
| 4,000,464 A | 12/1976 | Nussel | |
| 4,001,646 A | 1/1977 | Howell | |
| 4,066,950 A | 1/1978 | Rumold | |
| 4,159,499 A | 6/1979 | Breskin | |
| 4,161,011 A | 7/1979 | Wilkinson | |
| 4,206,398 A | 6/1980 | Janning | |

(Continued)

FOREIGN PATENT DOCUMENTS

JP        52-022422        9/1978

(Continued)

OTHER PUBLICATIONS

Beckwith Electric Co., M-3425A Generator Protection, Published: 2001, 28 pgs., Largo, Florida.

(Continued)

*Primary Examiner*—Vincent Q. Nguyen
*Assistant Examiner*—Hoai-An D Nguyen
(74) *Attorney, Agent, or Firm*—Eugene M. Cummings, P.C.

(57) ABSTRACT

An apparatus and method detects an open condition of a grounding path provided by a rotor grounding brush electrically connecting a rotor body of a rotor to electrical ground. The rotor includes an insulated field winding wrapped around the rotor body and is configured to generate a magnetic field upon receipt of an exciter voltage across lower and upper extremities of the insulated field winding. The method includes applying a square wave voltage signal to a second end of each of a first and a second buffer resistor, where a first end of each of the buffer resistors is operatively connected to respective upper and lower leads of the exciter voltage source, and calculating the total capacitance between the insulated field winding and electrical ground. The total capacitance when compared to a pre-selected capacitance value is determinative of the absence of the grounding path.

29 Claims, 6 Drawing Sheets

U.S. PATENT DOCUMENTS

| | | | | |
|---|---|---|---|---|
| 4,321,643 | A | 3/1982 | Vernier | |
| 4,371,832 | A | 2/1983 | Wilson | |
| 4,542,468 | A | 9/1985 | Taniguti | |
| 4,551,811 | A | 11/1985 | Taniguti | |
| 4,556,946 | A | 12/1985 | Taniguti | |
| 4,667,263 | A | 5/1987 | Morris | |
| 4,825,327 | A | 4/1989 | Alexander | |
| 4,851,758 | A * | 7/1989 | Osada et al. | 322/63 |
| 4,939,506 | A | 7/1990 | Gram | |
| 5,057,962 | A | 10/1991 | Alley | |
| 5,363,047 | A | 11/1994 | Dresti | |
| 5,514,963 | A | 5/1996 | Korbmacher | |
| 5,633,550 | A * | 5/1997 | Meehan et al. | 310/246 |
| 5,675,465 | A | 10/1997 | Tanaka et al. | |
| 5,739,693 | A | 4/1998 | Pfiffner | |
| 5,764,462 | A | 6/1998 | Tanaka et al. | |
| 5,933,306 | A | 8/1999 | Santos | |
| 5,982,595 | A | 11/1999 | Pozzuoli | |
| 6,169,489 | B1 | 1/2001 | Kliman | |
| 6,262,550 | B1 | 7/2001 | Kliman | |
| 6,396,284 | B1 | 5/2002 | Tisdale | |
| 6,426,632 | B1 * | 7/2002 | Clunn | 324/509 |
| 6,459,269 | B1 * | 10/2002 | Jones | 324/509 |
| 6,714,020 | B2 | 3/2004 | Hobelsberger | |
| 6,794,879 | B2 | 9/2004 | Lawson | |
| 6,794,883 | B2 | 9/2004 | Klingel | |
| 6,992,490 | B2 * | 1/2006 | Nomoto et al. | 324/522 |
| 2002/0140433 | A1 | 10/2002 | Lawson | |

FOREIGN PATENT DOCUMENTS

| | | |
|---|---|---|
| JP | 54-077549 | 1/1981 |
| JP | 02-003777 | 9/1991 |
| JP | 05-318853 | 7/1995 |
| JP | 09-309737 | 5/1999 |
| JP | 11-140927 | 11/2000 |

OTHER PUBLICATIONS

Siemens AG, Numerical Machine Protection Manual, Published: 1996, 232 pgs., Germany.

Type DGF Generator Field Relay, ABB Automation, Inc. Feb. 1977.

* cited by examiner

150

180

APPARATUS AND METHOD FOR DETECTING A BRUSH LIFTOFF IN A SYNCHRONOUS GENERATOR ROTOR CIRCUIT

CROSS-REFERENCE TO RELATED APPLICATIONS

None

BACKGROUND OF THE INVENTION

The present invention generally relates to synchronous generators, and more specifically, to an apparatus and method for detecting a brush liftoff in a synchronous generator rotor circuit.

Synchronous electrical generators ("synchronous generators") are used in electric utility systems to convert mechanical rotation (e.g., shaft rotation provided by a steam turbine) into alternating electric current via well-known electromagnetic principles. After suitable conditioning, the alternating electrical current is typically transmitted and distributed to a variety of power system loads.

In general, synchronous generator design is based on Faraday's law of electromagnetic induction and includes a rotating rotor driven by an external torque for inducing an electromagnetic field (EMF) in a stationary stator. The rotor includes a field winding wrapped around a rotor body, and the stator includes an armature winding wrapped around an armature body.

In operation, a direct current is made to flow in the field winding to generate a magnetic field. When the rotor is made to rotate, the magnetic field rotates with it, passing through the stator winding(s) and inducing an electric current therein.

Insulation material is utilized to cover the field winding(s) in order to electrically isolate the field winding(s) from the rotor body. As is known, detecting a loss of the insulation covering the field winding(s), or a field ground, is vital to ensuring reliable operation of the synchronous generator. While a field ground of insulation at one point along the field winding may be inconsequential to operation, field grounds at two locations along the field winding could result in serious damage to the synchronous generator.

One method used to achieve a field-ground protection is the so-called switched-DC injection method. One implementation of a switched-DC injection method is illustrated on page 61 of a Siemens AG instruction manual, entitled "Numerical Machine Protection 7UM515," version v3.1, dated 1996, the complete disclosure thereof being incorporated herein by reference. A variation of the switched-DC injection method is also described in U.S. Pat. No. 6,794,879, entitled "Apparatus and Method for Detecting and Calculating Ground Fault Resistance," issued on Sep. 24, 2004, naming Lawson et al. as inventors, the complete disclosure thereof being incorporated herein by reference. Unlike other switched-DC injection methods where a voltage is measured across a grounded "sense resistor" in order to determine a loss of field winding insulation, the '879 patent discloses using a voltage controlled oscillator (VCO) configured to measure a differential voltage across a floating sense resistor.

The switched-DC injection method requires that the rotor body be connected to electrical ground. This is typically accomplished by means of a (rotor) grounding brush. When the grounding brush no longer provides a low resistance circuit between the rotor body and electrical ground, "brush liftoff" has occurred, and the device performing the field-ground protection is no longer able to perform its task. Detecting such a brush liftoff, or open condition of the grounding path provided by the grounding brush, is therefore critical to reliable synchronous generator operation. The present invention provides such protection.

SUMMARY OF THE INVENTION

The invention is directed to a system and method for providing detection of a brush liftoff in a synchronous generator rotor circuit by monitoring and evaluating the capacitance between the field winding and electrical ground. A brush liftoff is declared when the monitored capacitance value undergoes a drastic reduction from its steady state capacitance value.

In accordance with one embodiment of the invention, a system for detecting brush liftoff in an electrical generator of the type which includes a rotor with an electrically conductive rotor body and an insulated field winding, the insulated field winding being wrapped around the rotor body and connected to receive an exciter voltage at first and second exciter nodes, and a rotor grounding brush electrically coupling the rotor body to electrical ground, includes first and second buffer resistors R each coupled at one end to a common node and at their opposite ends to respective ones of the first and second exciter nodes. The system further includes a signal generator coupled to apply a periodic oscillating voltage signal to the common node, a sense resistor $R_S$ coupling the signal generator to electrical ground, and a low-pass filter. The input of the low-pass filter is coupled across the sense resistor to receive positive and a negative sense resistor voltages $VRS_P$ and $VRS_N$. The low-pass filter develops a filtered positive sense resistor voltage signal $VRS_{P\_lp}$ and a filtered negative sense resistor voltage signal $VRS_{N\_lp}$. These signals are applied to a microcontroller programmed to calculate a total capacitance $C_{FG}$ between the insulated field winding and electrical ground from which an open rotor grounding circuit can be detected. The total capacitance is determined by taking an integrated value of a plurality of voltage samples divided by a proportionality constant, where the plurality of voltage samples are derived from the filtered positive sense resistor voltage signal $VRS_{P\_lp}$ during a positive one-half period of the periodic oscillating voltage signal, and the filtered negative sense resistor voltage signal $VRS_{N\_lp}$ during a negative one-half period of the periodic oscillating voltage signal.

In accordance with another embodiment of the invention, a method for detecting an open condition of a grounding circuit provided by a rotor grounding brush electrically connecting an electrically conductive body of a rotor to electrical ground includes a rotor having an insulated field winding wrapped around the electrically conductive body where the insulated field winding is coupled to receive an exciter voltage at first and second exciter nodes, includes applying a periodic oscillating voltage signal to a common node between first and second buffer resistors, coupling the exciter voltage to the first and second buffer resistors, calculating a total capacitance $C_{FG}$ between the insulated field winding and electrical ground, and determining from the total capacitance whether an open condition exists in the grounding circuit.

In accordance with a further embodiment of the invention, a method for detecting an open condition of a grounding circuit provided by a rotor grounding brush electrically connecting a rotor body of a rotor to electrical ground, wherein the rotor has an insulated field winding wrapped around the rotor body and the insulated field winding is configured to generate a magnetic field upon receipt of an exciter voltage from a voltage exciter connected at first and second exciter nodes at respective upper and lower extremities of the insulated field winding, includes applying a square wave voltage signal to a second end of each of a first and a second buffer resistor. A first end of each of the first and second buffer resistors is operatively connected to respective first and second exciter nodes. The method further includes integrating a voltage sample of a plurality of voltage samples over one of a positive and a negative one-half period of the square wave voltage signal to form an integrated value, and dividing the integrated value by a proportionality constant to calculate a total capacitance $C_{FG}$ between the insulated field winding and electrical ground, and declaring the open condition of the grounding path if the total capacitance is less than a preselected capacitance setting.

It should be understood that the present invention includes a number of different aspects and/or features which may have utility alone and/or in combination with other aspects or features. Accordingly, this summary is not an exhaustive identification of each such aspect or feature that is now or may hereafter be claimed, but represents an overview of certain aspects of the present invention to assist in understanding the more detailed description of preferred embodiments that follows. The scope of the invention is not limited to the specific embodiments described below, but is set forth in the claims now or hereafter filed.

BRIEF DESCRIPTION OF THE DRAWINGS

Although the characteristic features of this invention will be particularly pointed out in the claims, the invention itself, and the manner in which it can be made and used, can be better understood by referring to the following description taken in connection with the accompanying drawings forming a part hereof, wherein like reference numerals refer to like parts throughout the several views and in which:

DETAILED DESCRIPTION OF THE PREFERRED EMBODIMENTS

Figure 1:
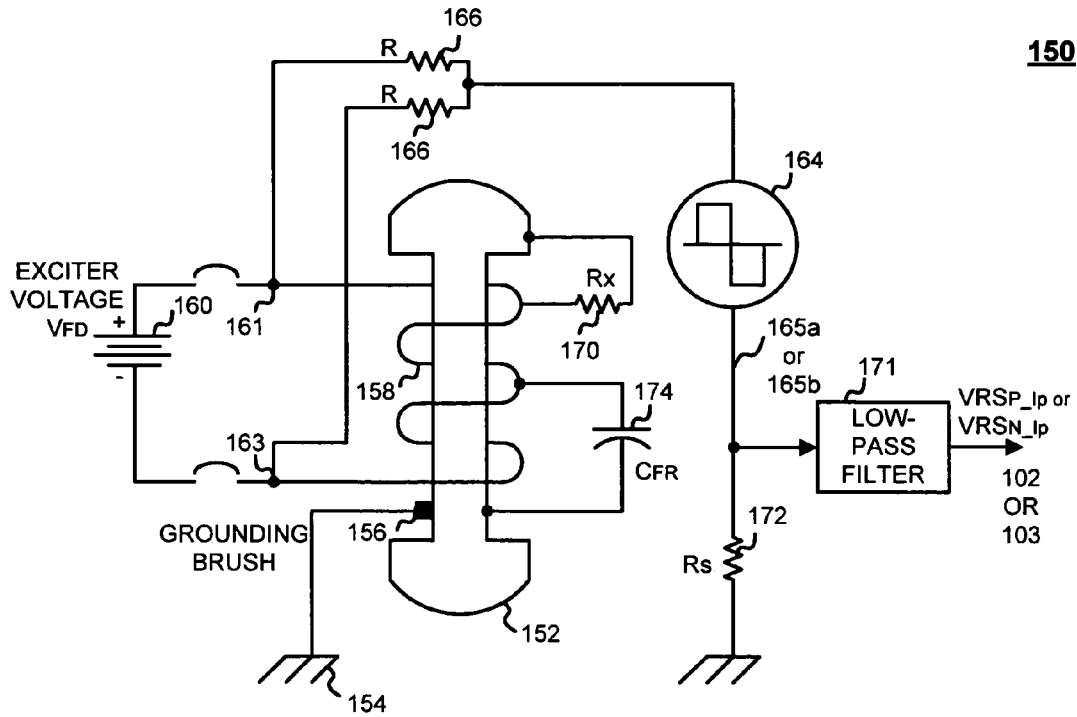
FIG. 1 is a single line schematic diagram of a synchronous generator rotor assembly which incorporates a switched-DC injection circuit for field ground protection, shown under normal grounding conditions.

Referring to the Drawings, and particularly to FIG. 1, a synchronous generator rotor assembly 150 incorporates a switched-DC injection circuit for field ground protection. The rotor assembly 150 includes a rotor body 152 coupled to electrical ground 154 via a grounding brush 156. The rotor body 152 is preferably formed from a conductive material, such as steel. A field winding 158, covered by an electrically insulating material, is wrapped around rotor body 152. When an exciter voltage $V_{FD}$ at 160 is applied at first and second exciter nodes 161 and 163 located at respective upper and lower winding extremities, a magnetic field is generated in and around rotor assembly 150.

To detect grounding of the field winding 158 a square wave voltage signal 164 is applied to first and second exciter nodes 161 and 163 on the field winding via buffer resistors R166. Signal 164 has a frequency $F_{DC}$ and provides positive and negative injected DC voltages $VDC_P$ 167 and $VDC_N$ 169, respectively (i.e., injected switched-DC current). The period $T_{DC}$ of signal 164 corresponds to switching frequency $F_{DC}$, and therefore during the period $T_{DC}$, each of the positive and negative injected DC voltages $VDC_P$ and $VDC_N$ are applied to respective exciter nodes 161, 163 during an interval equal to one-half of the period $T_{DC}$ or $T_{DC}/2$ 186. As illustrated, a low pass filter 171 is also included in the synchronous generator rotor assembly 150 to provide electrical noise abatement.

The synchronous generator rotor assembly 150 has a resistance $R_X$ between rotor body 152 and field winding 158; a resistance $R_S$ between a circuit node receiving the square wave voltage signal 164 and electrical ground 154; and a capacitance $C_{FR}$ between field winding 158 and rotor body 152. Under normal conditions (i.e., no brush liftoff), a capacitance value represented by the field capacitor $C_{FR}$ 174 is equal to the capacitance between field winding 158 and electrical ground 154.

Figure 2:
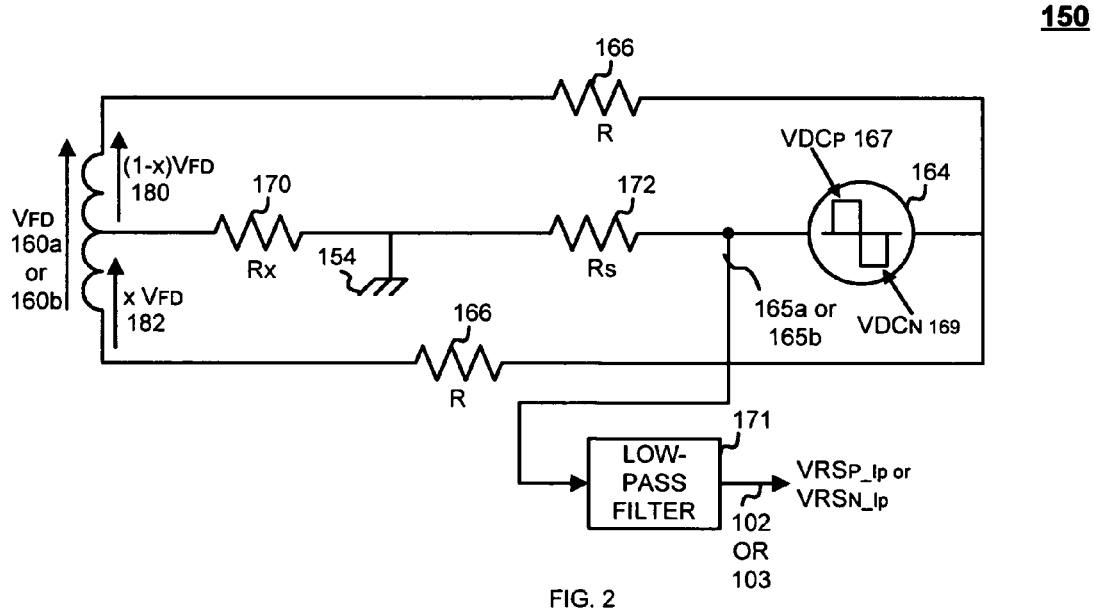
FIG. 2 is an electrical equivalent circuit of the synchronous generator rotor assembly of FIG. 1, shown in a steady state.

Referring to the electrical equivalent circuit of FIG. 2, if insulation resistor $R_X$ 170 has a substantially infinite value indicating no loss of field winding insulation, the voltage across the sense resistor $R_S$ 172 is substantially zero upon application of square-wave signal 164 as no DC current will flow. In that case, at the-end of the positive half-period of signal 164, the positive sense resistor voltage $VRS_P$ 165a across sense resistor $R_S$ 172 is zero. Similarly, at the end of the negative half-period of signal 164, the negative sense resistor voltage $VRS_N$ 165b across sense resistor $R_S$ 172 is zero. As a result, the magnitude of both of the filtered positive sense resistor voltage signal $VRS_P\_lp$ 102a and the filtered negative sense resistor voltage signal $VRS_N\_lp$ 102b are substantially zero at the end of the corresponding half-period.

Conversely, if insulation resistor $R_X$ 170 has a value indicating a loss of field winding insulation, a significant voltage will develop across sense resistor $R_S$ 172 upon application of signal 164 as DC current will flow. In that case, at the end of the positive half-period of signal 164, a positive sense resistor voltage $VRS_P$ 165a develops across the sense resistor $R_S$ 172. Similarly, at the end of the negative half-period of signal 164, a negative sense resistor voltage $VRS_N$ 165b develops across sense resistor $R_S$ 172. The magnitude of both of the filtered positive sense resistor voltage signal $VRS_{P\_}lp$ 102 and the filtered negative sense resistor voltage signal $VRS_{N\_}lp$ 103 will therefore have a significant non-zero value at the end of the corresponding one-half period. A brush liftoff determination is made at the end of every interval of time corresponding to the one-half period $T_{DC}/2$ 186, using integrated values of voltages of filtered positive sense resistor voltage signal $VRS_{N\_}lp$ 102a and filtered negative sense resistor voltage signal 102b $VRS_{N\_}lp$. It should be noted that the values of sense resistor $R_S$ 172 and each of the buffer resistors R 166 are fixed while the value of the insulation resistor $R_X$ 170 varies.

For ease of discussion, the following variables may be defined where:

$VDC_P$ (167)=positive injected DC voltage, injected during positive half-period $VDC_N$ (169)=negative injected DC voltage, injected during negative half-period $VRS_P$ (165a)=sense resistor voltage during positive half-period $VRS_N$ (165b)=sense resistor voltage during negative half-period $VRS_{P\_}lp$ (102)=filtered sense resistor voltage signal during positive half-period $VRS_{N\_}lp$ (103)=filtered sense resistor voltage signal during negative half-period $VFD_P$ (160a)=measured exciter voltage at the end of the positive half-period $VFD_N$ (160b)=measured exciter voltage at the end of the negative half-period Rs=sense resistor (172)

R=buffer resistors (166)

Rx=insulation resistor (170)

x=relative distance to a fault (varies between 0 and 1)

Referring again to FIG. 4, if it is assumed that the measured exciter voltage at the end of the positive half-period $VFD_P$ 160a and the measured exciter voltage at the end of the negative half-period $VFD_N$ 160b are equal with respect to time periods, resolving the electrical equivalent circuit of FIG. 2 yields the following equation for a value of the unknown insulation resistor $R_X$ 170:

$$R_X = \frac{R_S(VDC_P - VDC_N)}{VRS_P - VRS_N} - \left(\frac{R}{2} + R_S\right) \quad (1)$$

Alternatively, if the value of excitation voltage $VFD_P$ 160a at the end of the positive half-cycle and excitation voltage $VFD_N$ 160b at the end of the negative half-cycle are not assumed to be equal, the insulation resistance can be computed using Equation (2), taking into account the change into the excitation voltage:

$$R_X = \frac{R_S\left(\frac{VFD_N}{VFD_P}VDC_P - VDC_N\right)}{\frac{VFD_N}{VFD_P}VRS_P - VDC_N} - \left(\frac{R}{2} + R_S\right) \quad (2)$$

Equation (2) may be expressed otherwise by introducing the distance to the fault x (varying between 0 and 1) as a variable:

$$R_X = \frac{R_S(VDC_P - VDC_N) + \frac{R_S}{2}(2x-1)(VFD_P - VFD_N)}{VRS_P - VDC_N} - \left(\frac{R}{2} + R_S\right) \quad (3)$$

Equations (1) through (3) assume that the electrical equivalent circuit of FIG. 2 represents a steady state condition (i.e., the transient signal that is caused by the application of a DC voltage across a capacitor in series with resistor has faded away). In reality, however, when either the positive or the negative injected DC voltage $VDC_P$ 167 or $VDC_N$ 169 is applied to the first and second exciter nodes 161 and 163 respectively, the voltage across the sense resistor $R_S$ 172 undergoes a transient state (i.e., the positive and negative sense resistor voltages $VRS_P$ 165a and $VRS_N$ 165b) before it settles into a steady state.

Figure 3:
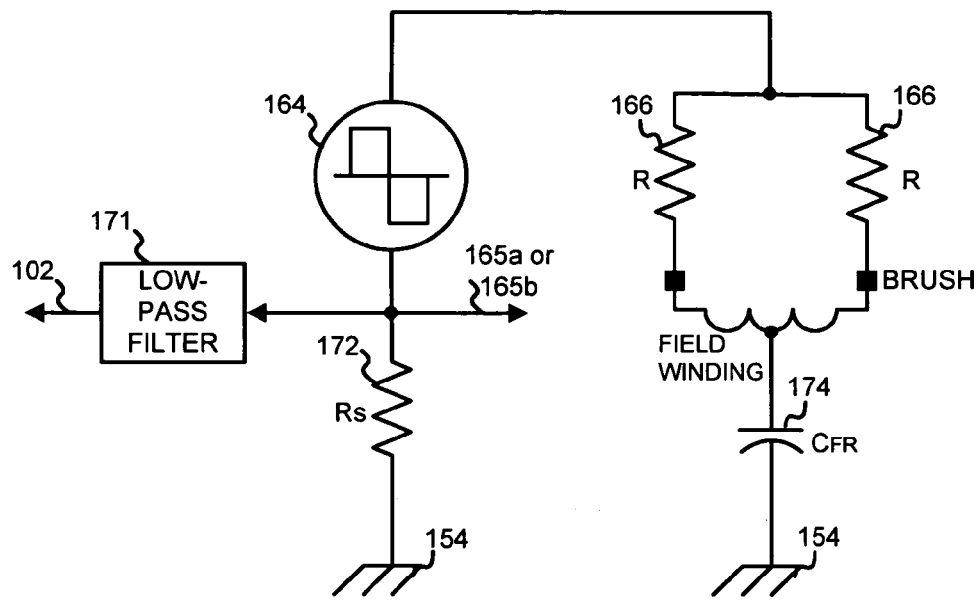
FIG. 3 is an electrical equivalent circuit of a switched-DC portion of the synchronous generator rotor assembly of FIG. 2 in a transient state, shown under normal grounding conditions.

The nature of such a transient voltage may be represented by FIG. 3, which illustrates an electrical equivalent circuit of the switched-DC portion of rotor assembly 150 in a transient state, with the grounding brush 156 electrically connecting rotor body 152 to electrical ground 154. As illustrated, FIG. 3 represents an application of a DC voltage across the field capacitor $C_{FR}$ 174 in series with the buffer resistors R 166. It is assumed that the field winding resistance is negligible as compared to the sum of the buffer resistors R 166 plus the sense resistor $R_S$ 172.

Figure 4:
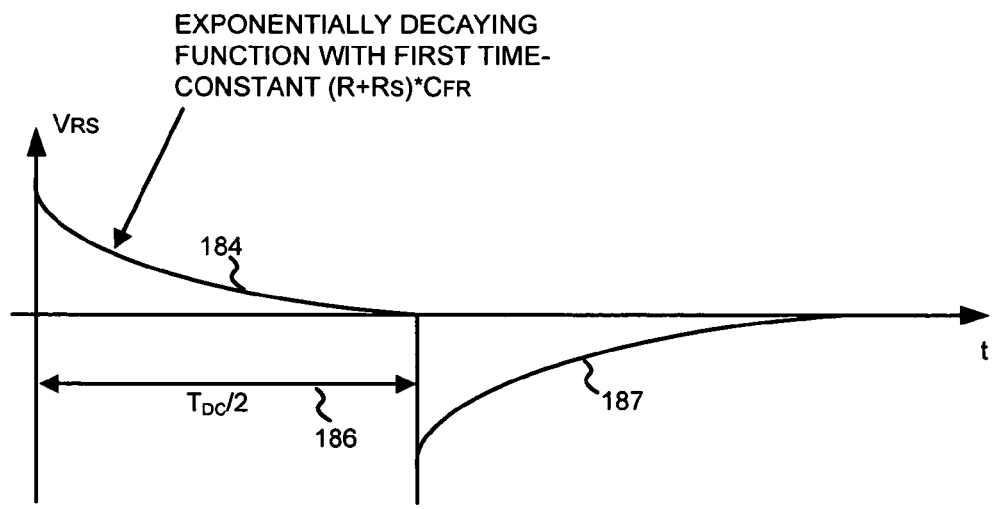
FIG. 4 is a graphical diagram of an exemplary transient waveform generated across a sense resistor of the electrical equivalent circuit of FIG. 3, shown under normal grounding conditions.

When the positive injected DC voltage $VDC_P$ 167 is first applied to the switched-DC portion of rotor assembly 150, the transient voltage across the sense resistor $R_S$ 172 will be an exponentially decaying waveform. For example, FIG. 4 is a graphical depiction of an exemplary positive transient waveform 184 generated across sense resistor $R_S$ 172 of the electrical equivalent circuit of FIG. 3, with the grounding brush 156 electrically connecting rotor body 152 to electrical ground 154. The positive transient waveform 184 is a result of the positive sense resistor voltage $VRS_P$ 165a and its subsequent exponential decay to a steady state. Referring to FIGS. 2, 3 and 4, the positive sense resistor voltage $VRS_P$ 165a equals a peak positive sense resistor voltage times a decaying exponential function $$VRS_P = VRS_{PEAK} * e^{-\frac{1}{\tau_{FIRST}}} \quad (4)$$

where $VRS_{peak}$ corresponds to the highest value of the exponentially decaying transient waveform that begins at the start of each one-half period $T_{DC}/2$ 186, and where a first time constant $\tau_{FIRST}$, or a pre-brush liftoff time constant, is equal to:

$$\tau_{FIRST} = (R+R_S) * C_{FR} \quad (5)$$

Referring to Equation (3), field capacitor $C_{FR}$ 174 is representative of the capacitance between field winding 158 and the rotor body 152. Because rotor body 152 is connected to electrical ground 154 via grounding brush 156, however, the capacitance value represented by field capacitor $C_{FR}$ 174 is also equal to the capacitance between field winding 158 and electrical ground 154.

The voltage across sense resistor $R_S$ 172 will also be a negative transient waveform 187 when the negative injected DC voltage $VDC_N$ 169 is applied to the electrical equivalent circuit of the switched-DC portion of rotor assembly 150. It should be noted that the voltage across sense resistor $R_S$ 172 is assumed to go to zero in a steady state. A zero voltage across sense resistor $R_S$ 172 corresponds to the situation where the insulation resistor $R_X$ 170 has very high value close to infinity and is therefore properly isolating field winding 158 from the electrical ground 154.

Figure 5:
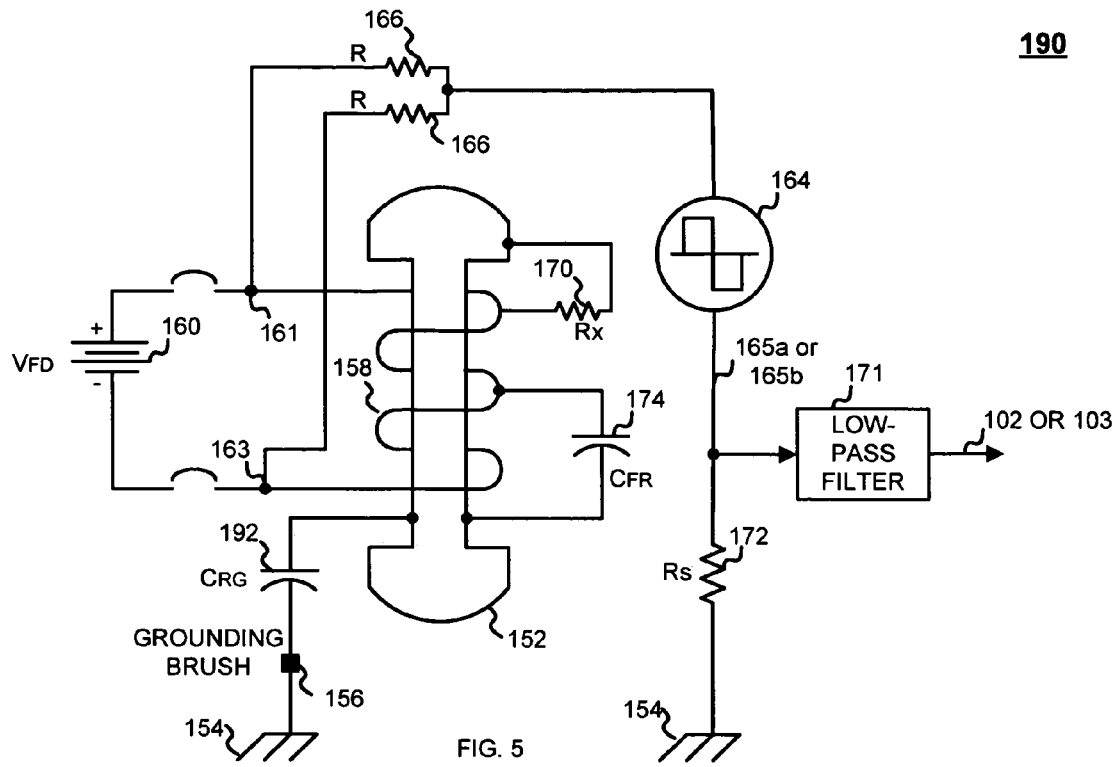
FIG. 5 is a schematic diagram of a synchronous generator rotor assembly which incorporates a switched-DC injection circuit for field ground protection, shown under abnormal grounding conditions.

FIGS. 1-3 illustrate a situation where no brush liftoff has occurred. When brush liftoff occurs, however, rotor body 152 is no longer connected to electrical ground 154 via the grounding brush 156. FIG. 5 is another schematic diagram of a rotor assembly 190 that incorporates a switched-DC injection circuit for field ground protection, with the grounding brush 156 disconnected from rotor body 152. Unlike the synchronous rotor assembly of FIG. 1, rotor body 152 is connected to electrical ground 154 via a capacitance represented as a new capacitor $C_{RG}$ 192. In that case, the capacitance value represented by the field capacitor $C_{FR}$ 174 typically ranges from 0.1 to 2 microfarads, while the capacitance value represented by capacitor $C_{RG}$ 192 is on the order of a few nanofarads.

Figure 6:
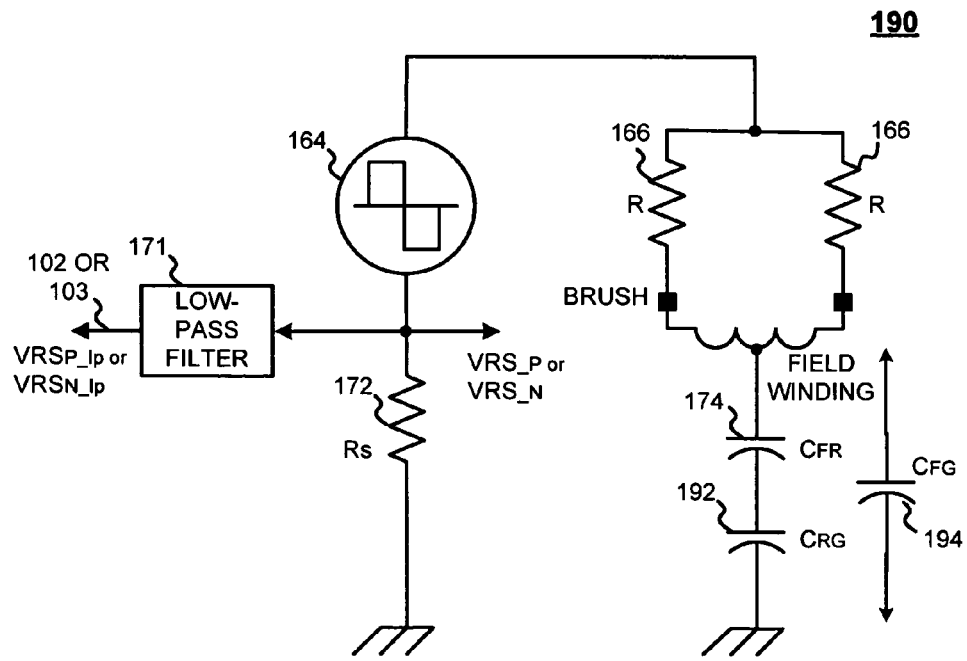
FIG. 6 is an electrical equivalent circuit of a switched-DC portion of the synchronous generator rotor assembly of FIG. 5 in a transient state, shown under abnormal grounding conditions.

FIG. 6 is an electrical equivalent circuit of the switched-DC portion of rotor assembly 190 in a transient state, with grounding brush 156 disconnected from rotor body 152. As illustrated, field capacitor $C_{FR}$ 174 is in series with capacitor $C_{RG}$ 192. Because the capacitance value represented by capacitor $C_{RG}$ 192 is typically much smaller than the capacitance value represented by field capacitor $C_{FR}$ 174, the value of the resulting total capacitance represented as capacitor $C_{FG}$ 194 (i.e., the field capacitor $C_{FR}$ 174 in series with the new capacitance $C_{RG}$ 192 ) will be much smaller than the pre-brush liftoff capacitance value represented by field capacitor $C_{FR}$ 174.

Because rotor body 152 is now connected to electrical ground 154 via capacitor $C_{RG}$ 192, due to the brush liftoff condition, a second time constant $\tau_{SECOND}$, or a post-brush liftoff time constant, may be defined as:

$$\tau_{SECOND} = (R + R_S)\left(\frac{C_{FR} * C_{RG}}{C_{FR} + C_{RG}}\right) \quad (6)$$

where the capacitance value represented by capacitor $C_{FG}$ 194 is much smaller than the pre-brush liftoff capacitance value represented by field capacitor $C_{FR}$ 174. As a result, the post-brush liftoff time constant $\tau_{SECOND}$ will be much smaller than the pre-brush liftoff time constant $\tau_{FIRST}$. Accordingly, an exponentially decaying transient signal will decay more quickly and the voltage across sense resistor $R_S$ 172 will settle to its steady state final value of zero much more rapidly.

In accordance with the invention, the filtered positive and negative sense resistor voltage signals 102 and 103 in a transient-state are used to determine an occurrence of a brush liftoff condition. More specifically, the positive and negative voltage signals across sense resistor $R_S$ 172 are processed through low-pass filter 171 to form the filtered positive sense resistor voltage signal $VRS_{P\_}lp$ 102 and the filtered negative sense resistor voltage signal $VRS_{N\_}lp$ 103. Then, as shown in Equations (1)-(6), the capacitance observed between field winding 158 and electrical ground 154 can be determined and utilized as an indicator of a brush liftoff or open condition of the grounding path.

Figure 7:
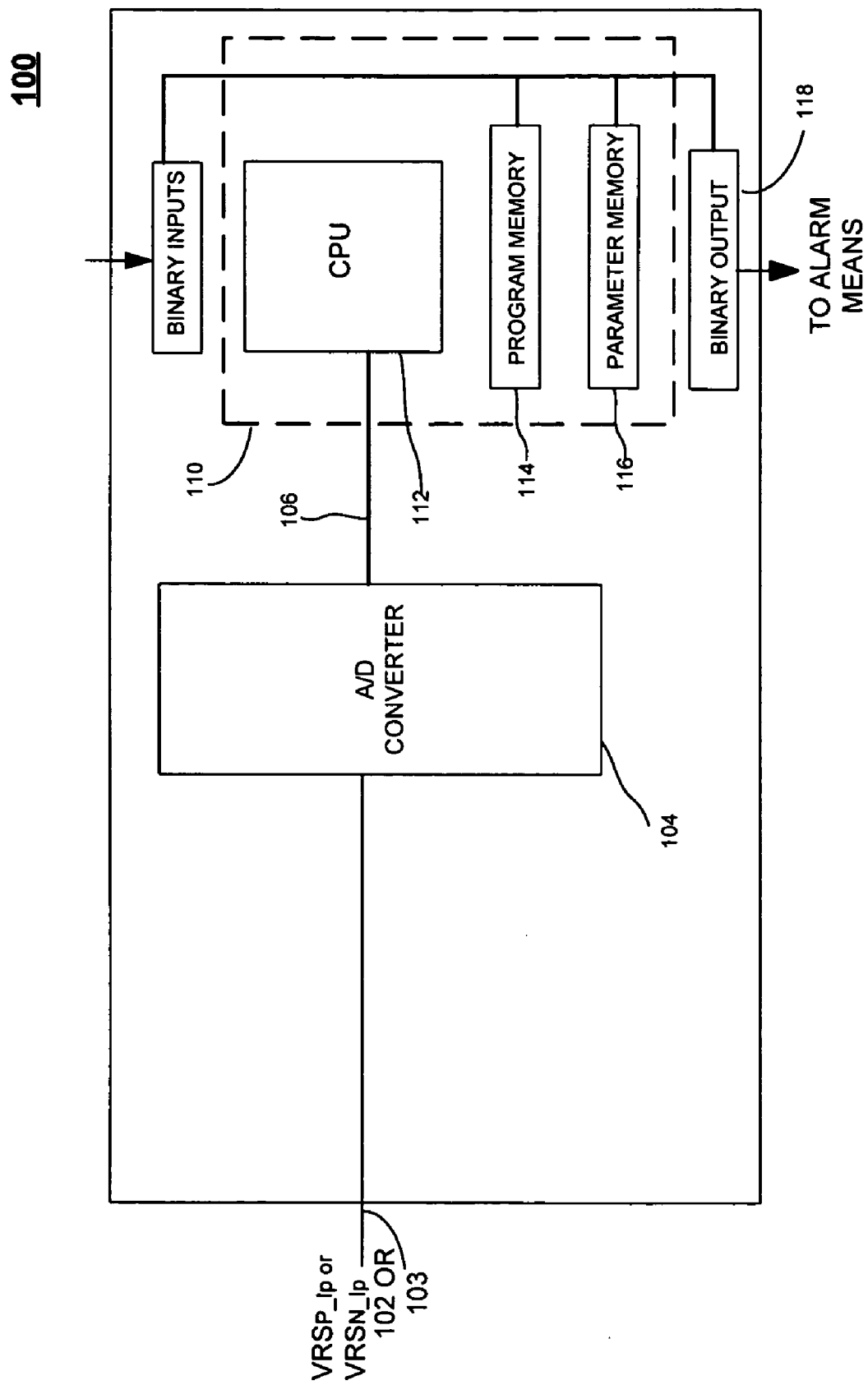
FIG. 7 is a schematic diagram illustrating a field ground module constructed in accordance with one embodiment of the invention.

FIG. 7 is a schematic diagram illustrating a field ground detection module 100, constructed in accordance with an embodiment of the invention. As illustrated, module 100 includes an input configured to receive filtered positive and negative sense resistor voltage signals 102 and 103 from switched-DC injection circuit 150 (discussed below in connection with FIG. 3). An analog-to-digital (A/D) converter 104 then multiplexes, samples and digitizes the filtered positive and negative sense resistor voltage signals 102 to form digitized voltage signals 106 suitable for use by a microcontroller 110. In a preferred embodiment, microcontroller 110 includes a CPU, or a microprocessor 112, a program memory 114 (e.g., a Flash EPROM) and a parameter memory 116 (e.g., an EEPROM). As will be appreciated by those skilled in the art, other suitable microcontroller configurations may be utilized. Further, although discussed in terms of a microcontroller, it should be noted that the embodiments presented and claimed herein may be practiced using an FPGA (field programmable gate array) or other equivalent.

The microprocessor 112, executing a computer program or voltage control logic scheme (discussed below in connection with FIG. 8), processes (each of) the digitized voltage signals 106, representative of the filtered positive and negative sense resistor voltage signals 102 and 103, to determine whether a field winding insulation problem has occurred and whether a brush liftoff has occurred. A binary contact output 118 actuates an alarm indication (e.g., an audio or visual alarm) to indicate a brush liftoff.

Figure 8:
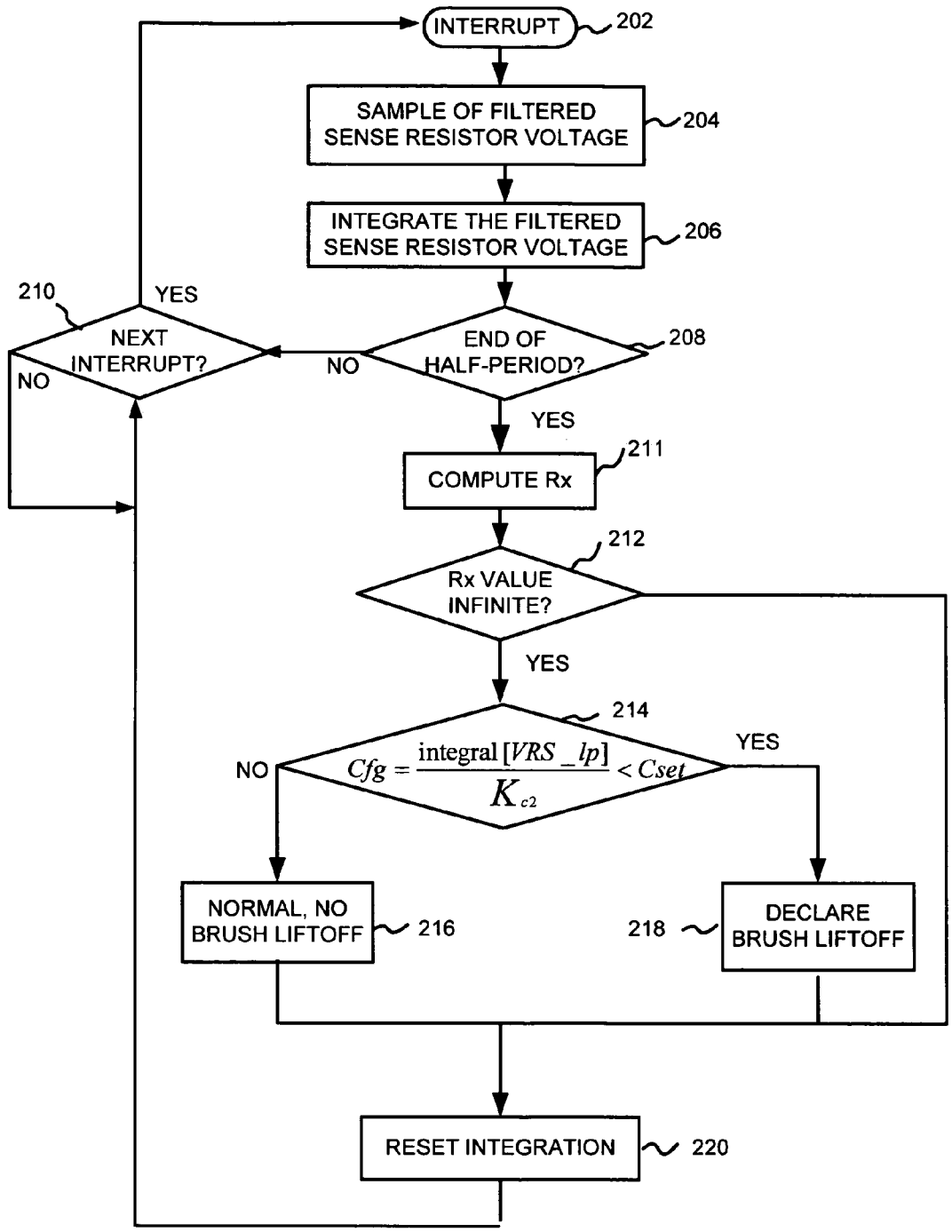
FIG. 8 is a functional block diagram illustrating a method for monitoring the capacitance between the field winding and electrical ground of a synchronous generator rotor assembly to determine a brush liftoff condition, in accordance with one embodiment of the invention.

FIG. 8 illustrates a method 200 for monitoring the capacitance between field winding 158 and the electrical ground 154, by processing the filtered positive and negative sense resistor voltage signals $VRS_{P\_}lp$ and $VRS_{N\_}lp$ to determine a brush liftoff.

As shown by FIG. 8, the method 200 begins when the microcontroller 110 is cyclically interrupted (step 202). An interrupt marks the beginning (or the end) of a predetermined interval. Although preferably selected to be between 0.1 and 1 milliseconds, the predetermined interval may be any suitable fixed frequency that enables effective monitoring of the capacitance between the field winding 158 and electrical ground 154. In an example, 500 interrupts will occur during a one-half period $T_{DC}/2$ 186 of 500 milliseconds, when the predetermined interval is selected to occur every 1 milliseconds.

Upon each interrupt, the microcontroller 110 measures either the filtered positive sense resistor voltage signal $VRS_{P\_}lp$ 102 or the filtered negative sense resistor voltage signal $VRS_{N\_}lp$ 103 to form a voltage sample of the positive or negative filtered sense resistor voltage signal (step 204). One voltage sample is measured upon each interrupt. As noted above, the filtered positive and negative sense resistor voltage signals in their transient state represent the voltage across sense resistor $R_S$ 172 during application of square wave voltage signal 164, subsequently filtered via the low-pass filter 171. Accordingly, the filtered positive sense resistor voltage signal $VRS_{P\_}lp$ 102 is sampled during application of the positive injected DC voltage $VDC_P$ 167 portion of square wave voltage signal 164, while the filtered negative sense resistor voltage signal $VRS_{N\_}lp$ 103 is sampled during application of negative injected DC voltage $VDC_N$ 169 portion of signal 164. For ease of discussion, the remaining steps of the method 200 will be described in terms of the filtered positive sense resistor voltage signal $VRS_{P\_}lp$ 102, it being understood that the method steps are equally applicable to the filtered negative sense resistor voltage signal $VRS_{N\_}lp$ 103.

Next, the microcontroller 110 integrates using the voltage samples measured from the filtered positive sense resistor voltage signal $VRS_{P\_}lp$ 102 over an interval of time equal to the one-half period $T_{DC}/2$ 186 (step 206). The integration is accomplished by summing the instantaneous samples of the filtered positive sense resistor voltage signal $VRS_{P\_}lp$ 102 in the transient-state during the interval of time equal to the one-half period $T_{DC}/2$ 186. Although illustrated as two steps 204 and 206, the steps of sampling and integrating the filtered positive sense resistor voltage signal $VRS_{P\_}lp$ 102 are continuous, with each new instantaneous voltage sample being used to update the integration, until the end of the one-half period $T_{DC}/2$ 186. Thus, for five hundred interrupts, the integration step is performed five hundred times.

An exponentially decaying transient waveform results upon initial application of either the positive injected DC voltage $VDC_P$ 167 portion or the negative injected DC voltage $VDC_N$ 169 portion of the square wave. Further, as demonstrated above in Equation (4), the value of the voltage across the sense resistor $R_S$ 172 after application of the positive injected DC voltage $VDC_P$ 167 is $$VRS_{PEAK} * e^{-\frac{1}{\tau}}$$

where $VRS_{PEAK}$ is the highest value of the exponentially decaying transient waveform. For purposes of the insulation resistance $R_x$ calculation, in order to effectively measure the final value of the positive sense resistor voltage $VRS_P$ 165a, it is necessary to wait until a value of its exponentially decaying transient waveform has become negligible. A square wave switching frequency $F_{DC}$ must therefore be selected to ensure that the last voltage sample measured from the filtered positive sense resistor voltage signal $VRS_{P\_}lp$ 102 (representative of the voltage across the sense resistor $R_S$ 172) at the end of the half-period is transient free.

To accomplish the last transient free voltage sample, the switching frequency $F_{DC}$ of the square wave signal 164 is selected so that the one-half period $T_{DC}/2$ 186 is a multiple of the longest expected time constants. For example, if the one-half period $T_{DC}/2$ 186 is selected to be five times the time constant $\tau$, a value of the exponentially decaying transient waveform decreases to a level within 1% of the steady state or its final value at the end of expiration of the one-half period $T_{DC}/2$ 186.

Integrating the positive sense resistor voltage $VRS_P$ 165a over the one-half period $T_{DC}/2$ 186 yields:

$$\text{integral}[VRS_P] = \qquad (7)$$

$$\int_0^{\frac{T_{DC}}{2}} VRS_{PEAK} e^{-\frac{1}{\tau}t} dt = -\tau VRS_{PEAK} e^{-\frac{1}{\tau}t} \Big|_0^{\frac{T_{DC}}{2}} = \tau VRS_{PEAK}$$

Substituting the value of the pre-brush liftoff time constant $\tau_{FIRST}=(R+R_S)*C_{FR}$ in the integral of the positive sense resistor voltage $VRS_P$ 165a yields a pre-brush liftoff integral:

$$\text{integral}[VRS_P]_{FIRST}=VRS_{PEAK}(R+R_S)*C_{FR} \qquad (8)$$

where $VRS_{PEAK}$, R and $R_S$ are constants having values fixed by the circuit design. A pre-LPF proportionality constant $K_{C1}$ can be introduced in the Equation (6) such that the integral of the positive sense resistor voltage $VRS_P$ 165a is proportional to the capacitance value represented by the field capacitor $C_{FR}$:

$$\text{integral}[VRS_P]_{FIRST}=|\text{integral}[VRS_N]|=K_{C1}C_{FR} \qquad (9)$$

Equation (9) also illustrates that the absolute value of the integral of the negative sense resistor voltage $VRS_N$ 165b is equal to the integral of the positive sense resistor voltage $VRS_P$ 165a.

As described in connection with Equation (6), the post-brush liftoff time constant $\tau_{SECOND}$ may be expressed as $$(R+R_S)\left(\frac{C_{FR}*C_{RG}}{C_{FR}+C_{RG}}\right).$$

Thus the integral of the positive sense resistor voltage $VRS_P$ 165a over the one-half period $T_{DC}/2$ during the brush liftoff condition may be expressed as:

$$\text{integral}[VRS_P]_{SECOND}=|\text{integral}[VRS_N]|=K_{C1}\frac{C_{FR}*C_{RG}}{C_{FR}+C_{RG}} \qquad (10)$$

Figure 9:
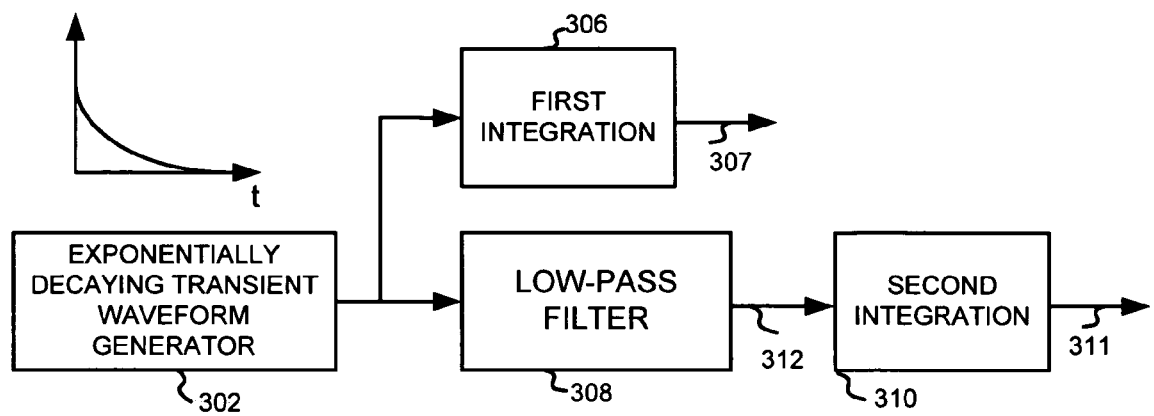
FIG. 9 is a functional block diagram of a mathematical simulation illustrating that inclusion of a low-pass filter in the synchronous generator rotor assembly of FIG. 5 does not affect the proportionality between an integral of a sense resistor voltage and a capacitance between the field winding and electrical ground.

As described in connection with FIG. 7, the field ground module 100 receives and processes the filtered positive sense resistor voltage signal $VRS_{P\_}lp$ 102 and the filtered negative sense resistor voltage signal $VRS_{N\_}lp$ 103 for purposes of providing field-ground protection and for purposes of detecting a brush liftoff; it does not receive their corresponding unfiltered positive and negative sense resistor voltages $VRS_P$ and $VRS_N$. FIG. 9 is a functional block diagram 300 of a mathematical simulation that may be used to illustrate that inclusion of low-pass filter 171 in rotor assemblies 150, 200 does not affect the proportionality between the integral of either the positive or negative sense resistor voltages 165a, 165b and the capacitance between field winding 158 and electrical ground 154 described in Equations (1)-(10).

Referring to FIG. 9, an exponentially decaying transient waveform generator 302 configured to generate the exponentially decaying transient waveform such as exponentially decaying transient waveform 184 and the exponentially decaying transient waveform 185 is provided. A first integration block 306 includes an input operatively coupled to an output generator 302 and is configured to perform an integration of the received exponentially decaying transient waveform. A low-pass $4^{th}$ order Butterworth filter 308 includes an input operatively coupled to the output of generator 302 and is configured to receive the exponentially decaying transient waveform and to form a low-pass filtered waveform 312. Low-pass filter 308 may have a cut-off frequency of 15.92 Hertz (Hz). A second integration block 310 includes an input operatively coupled to an output of filter 308 and is configured to integrate the low-pass filtered waveform 312 to form an integrated filtered transient waveform 311.

In operation, first integration is performed by the first integration block 306 by summing exponentially decaying transient waveform samples taken at a rate of 1 kHz (one sample every millisecond). The first integration yields an integrated transient waveform 307. The exponentially decaying transient waveform is also processed through the low-pass filter 308 and then integrated via the second integration block 310 to form the integrated filtered transient waveform 311.

The results of the first and second integrations are listed in Table 1:

TABLE 1

| Time-Constant (s) | Capacity (microF) | 1/Time-Constant | Integration I (307) | Integration II (311) |
|---|---|---|---|---|
| 0.375 | 10 | 2.666666667 | 373.67 | 373.07 |
| 0.28125 | 7.5 | 3.555555556 | 281.52 | 281.02 |
| 0.1875 | 5 | 5.333333333 | 188 | 187.52 |
| 0.09375 | 2.5 | 10.66666667 | 94.25 | 93.77 |
| 0.0375 | 1 | 26.66666667 | 38 | 37.52 |
| 0.028125 | 0.75 | 35.55555556 | 28.63 | 28.15 |

TABLE 1-continued

| Time-Constant (s) | Capacity (microF) | 1/Time-Constant | Integration I (307) | Integration II (311) |
|---|---|---|---|---|
| 0.01875 | 0.5 | 53.33333333 | 19.25 | 18.77 |
| 0.009375 | 0.25 | 106.6666667 | 9.88 | 9.4 |
| 0.00375 | 0.1 | 266.6666667 | 4.27 | 3.77 |
| 0.0028125 | 0.075 | 355.5555556 | 3.34 | 2.84 |
| 0.001875 | 0.05 | 533.3333333 | 2.42 | 1.9 |
| 0.0009375 | 0.025 | 1066.666667 | 1.52 | 0.963 |
| 0.000375 | 0.01 | 2666.666667 | 1.07 | 0.4 |

Figure 10:
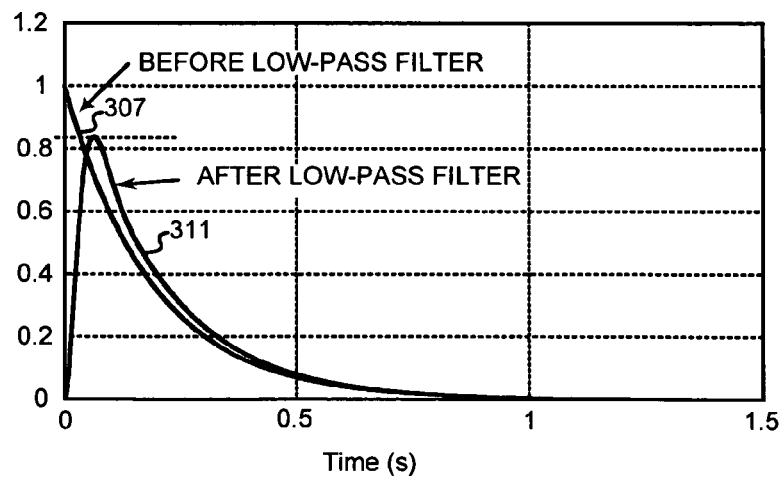
FIG. 10 is a graphical comparison of an integrated transient waveform and an integrated filtered transient waveform generated as a result of implementation of the mathematical simulation illustrated in FIG. 9.

For further illustration, FIG. 10 is a graphical comparison of the integrated transient waveform 307 and the integrated filtered transient waveform 311. A plot of the integrated transient waveform 307 as a function the field winding 158 to electrical ground 154 yields a straight line. Similarly, a plot of integrated filtered transient waveform 311 as a function the field winding 158 to electrical ground 154 yields a straight line. A comparison of the two plots indicates that inclusion of the low-pass filter 171 in the synchronous generator assemblies 150 and 200 does not affect the proportionality between the integral of either the positive or negative sense resistor voltages 165a, 165b and the capacitance between the field winding 158 and electrical ground 154. It should be noted however that the proportionality between the integral of either the positive or negative sense resistor voltages 165a, 165b and the capacitance between the field winding 158 and electrical ground 154 is slightly different between the first integration and the second integration, as illustrated in FIG. 10.

Based on the above analysis and Equations (9) and (10), the integrals of the pre- and post-brush liftoff filtered positive sense resistor voltage signal $VRS_P\_lp$ 102 may be expressed as:

$$\text{integral}[VRS_P\_lp]_{FIRST} = |\text{integral}[VRS_N\_lp]| = K_{C2} C_{FR} \quad (11)$$

$$\text{integral}[VRS_P\_lp]_{SECOND} = |\text{integral}[VRS_N\_lp]| = K_{C2} \frac{C_{FR} * C_{RG}}{C_{FR} + C_{RG}} \quad (12)$$

Replacement of the pre-LPF proportionality constant $K_{C1}$ with the post-LPF proportionality constant $K_{C2}$ confirms the small change between the constants of proportionality when the instantaneous voltage across the sense resistor $R_S$ 172 is measured at the output of the low-pass filter rather than at the input.

Referring again to FIG. 8, after integrating sample voltages of the filtered positive sense resistor voltage signal $VRS_P\_lp$ 102 (step 206), microcontroller 110 determines whether the end of the half-period $T_{DC}/2$ 186 has been reached (step 208). If the end of the half-period $T_{DC}/2$ 186 has not been reached, the microcontroller awaits the next interrupt (step 210) and repeats steps 204, 206 and 208. If the end of the half-period $T_{DC}/2$ 186 has been reached, microcontroller 110 determines a value of the insulation resistor $R_x$ 170 (step 211) and then determines whether the value of the insulation resistor $R_x$ 170 indicates a loss of field winding insulation (step 212) (see, Equation (1)).

As discussed in connection with FIG. 2, the insulation resistor $R_X$ 170 has a substantially infinite value when no loss of the field winding insulation is indicated. If, however, resistor $R_X$ 170 has a very small or zero value, loss of the field winding insulation is indicated. Referring again to FIG. 8, if the value of the insulation resistor $R_x$ 170 indicates a loss of field winding insulation (step 212), the microcontroller 110 resets the integration to zero (step 220) and awaits the next interrupt (step 210). If the value of the insulation resistor $R_x$ 170 indicates no loss of field winding insulation has occurred, the microcontroller 110 determines a capacitance between the field winding 158 and the electrical ground 154, or a capacitance value represented by the total capacitor $C_{FG}$ 194.

Assuming that the pre-LPF and post-LPF proportionality constants $K_{C1}$ and $K_{C2}$ are determined experimentally, Equations (13) and (14) provide a basis for computing the capacitance between the field winding 158 and the electrical ground 154 (i.e., a capacitance value represented by the total capacitor 194):

$$C_{FG} = \frac{\text{integral}[VRS_P]}{K_{C1}} = \frac{|\text{integral}[VRS_N]|}{K_{C1}} \quad (13)$$

or:

$$C_{FG} = \frac{\text{integral}[VRS_P\_lp]}{K_{C2}} = \frac{|\text{integral}[VRS_N\_lp]|}{K_{C2}} \quad (14)$$

Because the voltage samples used for the integration step 206 are based on the filtered positive sense resistor voltage signal $VRS_P\_lp$ 102, the value of the total $C_{FG}$ 194 is calculated using Equation (14) (step 214). When a brush liftoff situation occurs, the capacitance between the field winding 158 and the electrical ground 154 undergoes a change from a higher capacitance (i.e., the higher value of $C_{FR}$ 174) to a much lower value (the lower value of $C_{FR}$ 174 in series with $C_{RG}$ 192).

Referring again to FIG. 8, at step 214 after determining the capacitance value represented by capacitor $C_{FG}$ 194, the microcontroller 110 compares the value to a pre-selected threshold setting $C_{SET}$. If the value is greater than the pre-selected threshold setting $C_{SET}$ then no brush liftoff is declared (step 216) and the integration is reset to zero (step 220). However, if the value is less than or equal to the pre-selected threshold value $C_{SET}$, then brush liftoff is declared (step 218) and the integration is reset to zero (step 220). The microcontroller 100 may also cause an alarm indication.

Upon a determination of whether a brush liftoff has occurred during the half-period $T_{DC}/2$ 186 in which the filtered positive sense resistor voltage signal $VRS_P\_lp$ 102a was sampled and integrated, the microcontroller 110 begins sampling and integrating the filtered negative sense resistor voltage signal $VRS_N\_lp$ 102b, and vice versa. In this way, the determination of whether a brush liftoff has occurred is performed twice for the time interval of one period $T_{DC}$ 185. It is contemplated however that the determination of whether a brush liftoff has occurred may also be performed more or less times during the time interval of one period $T_{DC}$ 185, depending on the time interval selected for step 208.

The present method may be implemented as a computer process, a computing system or as an article of manufacture such as a computer program product or computer readable medium. The computer program product may be a computer storage media readable by a computer system and encoding a computer program of instructions for executing a computer process. The computer program product may also be a propagated signal on a carrier readable by a computing system and encoding a computer program of instructions for executing a computer process.

In one embodiment, the logical operations of the present method are implemented (1) as a sequence of computer implemented acts or program modules running on a computing system and/or (2) as interconnected machine logic circuits or circuit modules within the computing system. The implementation is a matter of choice dependent on the performance requirements of the computing system implementing the invention. Accordingly, the logical operations making up the embodiments of the present invention described herein are referred to variously as operations, structural devices, acts or modules. It will be recognized by persons skilled in the art that these operations, structural devices, acts and modules may be implemented in software, in firmware, in special purpose digital logic, and any combination thereof without deviating from the spirit and scope of the present invention as recited within the claims attached hereto.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

What is claimed is:

1. For use with an electrical generator having a rotor with an electrically conductive rotor body, an insulated field winding wrapped around the rotor body, the field winding being connected to receive an exciter voltage at first and second exciter nodes, and a rotor grounding brush providing a grounding path between the rotor body and electrical ground, a system for detecting an open condition of the grounding path, the system comprising:
    first and second buffer resistors coupled at a common node on one side of the first and second resistors, the opposite sides of the first and second resistors being coupled to respective one of the first and second exciter nodes;
    a signal generator coupled to apply a periodic oscillating voltage signal to the common node;
    a sense resistor coupling the signal generator to electrical ground;
    a low-pass filter having an input coupled to receive a positive and a negative sense resistor voltage representative of a positive and negative voltage across the sense resistor, and having an output coupled to deliver a filtered positive sense resistor voltage signal and a filtered negative sense resistor voltage signal; and
    a microcontroller coupled to the low pass filter and programmed to calculate a total capacitance between the insulated field winding and electrical ground to detect the open condition of the grounding path.

2. The system of claim 1, wherein the total capacitance equals an integrated value of a plurality of voltage samples divided by a proportionality constant, wherein the plurality of voltage samples are derived from the filtered positive sense resistor voltage signal during a positive one-half period of the periodic oscillating voltage signal and the filtered negative sense resistor voltage signal during a negative one-half period of the periodic oscillating voltage signal.

3. The system of claim 2, wherein the total capacitance $C_{FG}$ equals:

$$C_{FG} = \frac{\text{integral}[VRS_{P\_lp}]}{K_{C2}} = \frac{|\text{integral}[VRS_{N\_lp}]|}{K_{C2}}$$

where $VRS_{P\_lp}$ represents the filtered positive sense resistor voltage signal, $VRS_{N\_lp}$ represents the filtered negative sense resistor voltage signal, and $K_{C2}$ represents a proportionality constant.

4. The system of claim 3, wherein the proportionality constant is determined experimentally to enable the integrated value of the plurality of voltage samples to be proportional to the total capacitance.

5. The system of claim 1, wherein the microcontroller is further programmed to:
    (a) cause an interrupt at a predetermined time interval;
    (b) measure a value of the filtered positive sense resistor voltage signal to form a voltage sample;
    (c) integrate the voltage sample over a positive one-half period of the periodic oscillating voltage signal to form a value of an integral of the filtered positive sense resistor voltage signal;
    (d) if an end of the positive one-half period is reached, determine a value of an insulation resistance $R_X$ between the electrically conductive body and the insulated field winding;
    (e) if the value of the insulation resistance $R_X$ is infinite, divide the value of the integral of the filtered positive sense resistor voltage signal by a proportionality constant to calculate the total capacitance; and
    (f) if the total capacitance is less than a pre-selected capacitance setting, declare the open condition of the grounding path, and reset the value of the integral to zero.

6. The system of claim 5, wherein the microcontroller is further programmed to repeat steps (a)-(c) if the end of the positive one-half period is not reached.

7. The system of claim 5, wherein the microcontroller is further programmed to reset the value of the integral to zero if the value of the insulation resistance $R_X$ is not infinite.

8. The system of claim 5, wherein the microcontroller is further programmed to:
    not declare the open condition of the grounding path if the total capacitance is not less than the pre-selected capacitance setting; and
    reset the value of the integral to zero.

9. The system of claim 1, wherein the microcontroller is further programmed to:
    (a) cause an interrupt at a predetermined time interval;
    (b) measure a value of the filtered negative sense resistor voltage signal to form a voltage sample;
    (c) integrate the voltage sample over a negative one-half period of the periodic oscillating voltage signal to form a value of an integral of the filtered negative sense resistor voltage signal;
    (d) if an end of the negative one-half period is reached, determine a value of an insulation resistance $R_X$ between the electrically conductive body and the insulated field winding;
    (e) if the value of the insulation resistance $R_X$ is infinite, divide the value of the integral of the filtered negative sense resistor voltage signal by a proportionality constant to calculate the total capacitance; and
    (f) if the total capacitance is less than a pre-selected capacitance setting, declare the open condition of the grounding path, and reset the value of the integral to zero.

10. The system of claim 9, wherein the microcontroller is further programmed to repeat steps (a)-(c) if the end of the negative one-half period is not reached.

11. The system of claim 9, wherein the microcontroller is further programmed to reset the value of the integral to zero if the value of the insulation resistance is not infinite.

12. The system of claim 9, wherein the microcontroller is further programmed to:
not declare the open condition of the grounding path if the total capacitance is not less than the pre-selected capacitance setting; and
reset the value of the integral to zero.

13. The system of claim 1, wherein the periodic oscillating voltage signal comprises a square wave voltage signal.

14. The system of claim 1, wherein the electrically conductive rotor body comprises a steel rotor body.

15. A method for detecting an open condition of a grounding path provided by a rotor grounding brush electrically connecting an electrically conductive body of a rotor to electrical ground, the rotor including an insulated field winding wrapped around the electrically conductive body and coupled to receive an exciter voltage at first and second exciter nodes, the method comprising:
applying a periodic oscillating voltage signal to a common node between first and second buffer resistors;
coupling the exciter voltage to the first and second buffer resistors;
calculating a total capacitance between the insulated field winding and electrical ground; and
detecting the open condition of the grounding path based on the total capacitance.

16. The method of claim 15, further comprising:
comparing the total capacitance to a pre-selected capacitance setting if, at the end of a one-half period of the periodic oscillating voltage signal, a resistance value between the insulated field winding and the electrically conductive body is substantially infinite;
declaring the open condition of the grounding path if the total capacitance is less than the pre-selected capacitance setting; and
not declaring the open condition of the grounding path if the total capacitance is greater than the pre-selected capacitance setting.

17. The method of claim 16, further comprising:
during the one-half period, deriving a plurality of voltage samples from one of a positive voltage and a negative voltage generated across a sense resistor, the sense resistor operatively coupling a generator of the periodic oscillating voltage signal to electrical ground;
integrating a value of the plurality of voltage samples to form an integrated value; and
dividing the integrated value by a proportionality constant to calculate the total capacitance.

18. The method of claim 17, wherein the plurality of voltage samples are measured from a filtered negative sense resistor voltage signal during a negative one-half period of the periodic oscillating voltage signal, the filtered negative sense resistor voltage signal resulting from filtering the negative voltage generated across the sense resistor.

19. The method of claim 17, wherein the plurality of voltage samples are measured from a filtered positive sense resistor voltage signal during a positive one-half period of the periodic oscillating voltage signal, the filtered positive sense resistor voltage signal resulting from filtering the positive voltage generated across the sense resistor.

20. The method of claim 15, wherein the total capacitance $C_{FG}$ equals:

$$C_{FG} = \frac{\text{integral}[VRS_{P\_}\text{lp}]}{K_{C2}} = \frac{|\text{integral}[VRS_{N\_}\text{lp}]|}{K_{C2}}$$

where $VRS_{P\_}\text{lp}$ represents a filtered positive sense resistor voltage signal derived from a positive voltage generated across a sense resistor operatively coupling a generator of the periodic oscillating voltage signal to electrical ground, $VRS_{N\_}\text{lp}$ represents a filtered negative sense resistor voltage signal derived from a negative voltage generated across the sense resistor, and $K_{C2}$ represents a proportionality constant.

21. The method of claim 20, further comprising experimentally determining the proportionality constant.

22. The method of claim 15, wherein the periodic oscillating voltage signal comprises a square wave voltage signal.

23. The method of claim 15, wherein the electrically conductive rotor body comprises a steel rotor body.

24. A method for detecting an open condition of a grounding path provided by a rotor grounding brush electrically connecting a rotor body of a rotor to electrical ground, the rotor including an insulated field winding wrapped around the rotor body and configured to generate a magnetic field upon receipt of an exciter voltage from a voltage exciter connected at first and second exciter nodes at respective upper and lower extremities of the insulated field winding, the method comprising:
applying a square wave voltage signal to a second end of each of a first and a second buffer resistor, a first end of each of the first and second buffer resistors operatively connected to respective first and second exciter nodes;
integrating a voltage sample of a plurality of voltage samples over one of a positive and a negative one-half period of the square wave voltage signal to form an integrated value, the plurality of voltage samples derived from one of a positive voltage and a negative voltage generated across a sense resistor operatively coupling a generator of the square wave voltage signal to electrical ground;
if the end of one of the positive and the negative one-half period of the square wave voltage signal has been reached and a value of an insulation resistance between the rotor body and the insulated field winding is substantially infinite, dividing the integrated value by a proportionality constant to calculate a total capacitance between the insulated field winding and electrical ground; and
declaring the open condition of the grounding path if the total capacitance is less than a pre-selected capacitance setting.

25. The method of claim 24, wherein the plurality of voltage samples are measured from a filtered negative sense resistor voltage signal during a negative one-half period of the square wave voltage signal, the filtered negative sense resistor voltage signal resulting from filtering the negative voltage generated across a sense resistor.

26. The method of claim 24, wherein the plurality of voltage samples are measured from a filtered positive sense resistor voltage signal during a positive one-half period of the square wave voltage signal, the filtered positive sense resistor voltage signal resulting from filtering the positive voltage generated across a sense resistor.

27. The method of claim 24, wherein the step of integrating the value of the plurality of voltage samples further comprises:
(a) causing an interrupt at a predetermined time interval;
(b) adding the voltage sample of the plurality of voltage samples to previous voltage samples of the plurality of voltage samples; and
(c) if the end of one of the positive and the negative one-half period has not been reached, repeating steps (a) to (c).

28. A computer readable storage medium having program code recorded thereon for detecting an open condition of a grounding path provided by a rotor grounding brush electrically connecting an electrically conductive body of a rotor to electrical ground, the rotor including an insulated field winding wrapped around the electrically conductive body and connected to receive an exciter voltage at first and second exciter nodes, comprising;
- a first program code encoded in computer-readable storage media for applying a periodic oscillating voltage signal to a common node between first and second buffer resistors;
- a second program code encoded in computer-readable storage media for coupling the exciter voltage to the first and second buffer resistors;
- a third program code encoded in computer-readable storage media for calculating a total capacitance between the insulated field winding and electrical ground; and
- a fourth program code encoded in computer-readable storage media for determining from the total capacitance whether an open condition exists in the grounding path.

29. A computer readable storage medium having program code recorded thereon for detecting an open condition of a grounding path provided by a rotor grounding brush electrically connecting a rotor body of a rotor to electrical ground, the rotor including an insulated field winding wrapped around the rotor body and configured to generate a magnetic field upon receipt of an exciter voltage from a voltage exciter connected at first and second exciter nodes at respective upper and lower extremities of the insulated field winding, comprising;
- a first program code encoded in computer-readable storage media for causing a square wave voltage signal to be generated and applied to a second end of a first and a second buffer resistor, a first end of each of the first and a second buffer resistors operatively connected to respective first and second exciter nodes;
- a second program code encoded in computer-readable media for causing an interrupt at a predetermined time interval;
- a third program code encoded in computer-readable storage media for measuring a value of one of a filtered negative sense resistor voltage signal and a filtered positive sense resistor voltage signal to form a voltage sample, the filtered negative sense resistor voltage signal derived from a negative voltage generated across a sense resistor operatively coupling the generator to electrical ground, the filtered positive sense resistor voltage signal derived from a positive voltage generated across the sense resistor;
- a fourth program code encoded in computer-readable storage media for integrating the voltage sample over one of a negative one-half period and a positive one-half period of the square wave voltage signal to form a value of an integral of one of the corresponding filtered negative sense resistor voltage signal and the filtered positive sense resistor voltage signal;
- a fifth program code encoded in computer-readable storage media for determining a value of an insulation resistance between the rotor body and the insulated field winding if an end of one of negative and the positive one-half period is reached;
- a sixth program code encoded in computer-readable storage media for dividing the value of the integral of the one of the corresponding filtered negative sense resistor voltage signal and the filtered positive sense resistor voltage signal by a proportionality constant to calculate a total capacitance if the value of the insulation resistance is substantially infinite; and
- a seventh program code encoded in computer-readable storage media for declaring the open condition of the grounding path if the total capacitance is less than a pre-selected capacitance setting.

* * * * *